US006756288B1

(12) United States Patent
Feil et al.

(10) Patent No.: US 6,756,288 B1
(45) Date of Patent: Jun. 29, 2004

(54) METHOD OF SUBDIVIDING A WAFER

(75) Inventors: Michael Feil, Munich (DE); Christof Landesberger, Munich (DE); Armin Klumpp, Munich (DE); Erwin Hacker, Kaufbeuren (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 200 days.

(21) Appl. No.: 10/019,138

(22) PCT Filed: Jun. 21, 2000

(86) PCT No.: PCT/EP00/05772

§ 371 (c)(1),
(2), (4) Date: Jun. 3, 2002

(87) PCT Pub. No.: WO01/03180

PCT Pub. Date: Jan. 11, 2001

(30) Foreign Application Priority Data

Jul. 1, 1999 (EP) ............................................. 99112540
Dec. 23, 1999 (DE) ......................................... 199 62 763

(51) Int. Cl.⁷ ........................................... H01L 21/301
(52) U.S. Cl. ......................... 438/464; 438/113; 29/413
(58) Field of Search ............................... 438/464, 460, 438/113; 29/413, 417, 418

(56) References Cited

U.S. PATENT DOCUMENTS

| | | | |
|---|---|---|---|
| 4,722,130 A | 2/1988 | Kimura et al. | |
| 5,071,792 A | 12/1991 | VanVonno et al. | |
| 5,476,566 A | 12/1995 | Cavasin | |
| 5,910,687 A | 6/1999 | Chen et al. | |
| 6,040,204 A | * 3/2000 | Herden et al. | 438/109 |
| 6,184,109 B1 | * 2/2001 | Sasaki et al. | 438/464 |
| 6,444,487 B1 | * 9/2002 | Boggs et al. | 438/48 |

FOREIGN PATENT DOCUMENTS

| | | |
|---|---|---|
| DE | 4241045 C1 | 5/1994 |
| DE | 19743349 A1 | 4/1999 |
| DE | 19753448 A1 | 6/1999 |
| DE | 19840508 A1 | 12/1999 |
| JP | 05291397 A1 | 11/1993 |
| WO | WO 99/25019 A1 | 5/1999 |

OTHER PUBLICATIONS

Shumate, David et al., "Silicon Wafer Thinning and Dicing Round or Non Orthogonal Die Using Dry Etching," Motorola Technical Developments, Oct. 31, 1994, p. 8, vol. 23, Motorola, Inc., USA.

* cited by examiner

Primary Examiner—Douglas Wille
(74) Attorney, Agent, or Firm—Glenn Patent Group; Michael A. Glenn

(57) ABSTRACT

In a method of dicing a wafer, which comprises a plurality of individual circuit structures, a trench is first defined between at least two circuit structures on one face of the wafer. Subsequently, the trench is deepened down to a defined depth. Following this, one face of the wafer has fixed thereto a re-detachable intermediate support composed of a fixed intermediate support substrate and an adhesive medium which is applied to said intermediate support substrate and which can specifically be modified in terms of its adhesive strength, whereupon the wafer is dry-etched from the opposite face so that circuit chips are obtained which are connected to one another only via the intermediate support. Subsequently, the circuit chips are removed from the intermediate support. This method substantially reduces mechanical impairments that may occur during dicing of the circuit chips; on the one hand, this permits the production of circuit chips with a thickness of less than 50 μm and, on the other hand, it leads to mechanically substantially undamaged circuit chips.

8 Claims, 1 Drawing Sheet

METHOD OF SUBDIVIDING A WAFER

FIELD OF THE INVENTION

The present invention relates to the production of integrated circuits and, in particular, to a method of dicing a wafer, which comprises a plurality of individual circuit structures, so as to obtain very thin circuit chips.

BACKGROUND OF THE INVENTION AND PRIOR ART

Recently, there has been an increasing demand for thin chips on the one hand and high flexibility on the other so as to be able to use electronic circuit chips in a great variety of cases. The demand for thin circuit chips results, on the one hand, from increasingly complex electronic systems which should be composed of individual, fully processed chips that can be obtained from various manufacturers; simultaneously, these electronic systems should also be suitable for use in the field of high-frequency technology and they should take up little space. In order to keep the price of the whole system low, it should be possible to build up such chips, or modules including such chips, by means of conventional, economy-priced manufacturing methods.

One of the essential demands is, in particular, that pre-processed chips, which can be acquired as finished components, should be usable for the greatest possible number of applications so as to be e.g. independent of a single chip manufacturer, or so as to avoid the necessity of developing one's own chips, which would lead to higher prices in many cases, and so as to be able to concentrate exclusively on the interconnection of the individual chip components when a new system is being developed. Investigations have shown that e.g. in the case of simple silicon circuit chips up to 90% of the added value of the future product lie in the sphere of assembly and connection technologies, but not in the manufacture of the wafer from which the individual circuit chips can be produced by dicing.

It follows that pre-processed wafers must be used for obtaining the individual circuit chips by dicing.

U.S. Pat. No. 4,722,130 describes a method of producing semiconductor chips by dicing a semiconductor wafer. For this purpose, the front of the wafer has formed therein a lattice-shaped trench, whereupon an adhesive nylon foil, which is adherent on one side, is applied to the wafer front having the trench formed therein. Subsequently, the back of the support is ground so as to thin the wafer down to a defined thickness, the thickness of the thinned wafer being chosen such that the individual circuit chips, which have already been defined by the trenches, are interconnected by comparatively thin connection bridges. For separating the individual circuit chips, which are connected by connection bridges, the adhesive nylon foil is stripped off from one side of the wafer; this has effect that the connection bridges between the circuit chips break due to the pulling effect occurring when the adhesive foil is being stripped off. When the adhesive foil has been stripped off, the diced chips are still attached to an elastic support foil on the opposite side of the chip, which has been attached prior to stripping off the adhesive nylon foil. The elastic adhesive foil is then stretched transversally, whereby the spaces between the circuit chips are widened; this is easily possible, since the connection bridges have already been broken. The individual circuit chips can then be removed and inserted or used where they are needed. Circuit chips produced in this way have a thickness of approx. 160 $\mu$m; the starting material used was a standard GaAs wafer which had a thickness of 630 $\mu$m before it was thinned by grinding.

This method is disadvantageous insofar as it cannot be used for producing very thin and, consequently, also very sensitive chips. The mechanical thinning and the mechanical dicing of the chips by breaking the connection bridges entails the danger that the individual chips may be mechanically damaged or may have rough or even torn edges. In the case of chips having a thickness of 160 $\mu$m, such problems are not yet very grave. If the chips to be produced are, however, chips having a thickness of less than 50 $\mu$m, and, in particular, less than 20 $\mu$m, such tears may cause high production losses due to the mechanical processing of the back and the mechanical breaking of the connection bridges, since, due to the very small thickness, it may easily happen that active regions of the chips are impaired or even destroyed.

WO 99/25019 refers to a method of thinning semiconductor wafers. In a first step, a plurality of grooves is defined in the front of a semiconductor wafer. The grooves separate each integrated circuit such that it defines a separate chip. The grooves extend only partially into the front. When the grooves have been produced, a polyimide layer is applied so as to planarize the wafer provided with the grooves, the polyimide layer being used as a stress compensation layer for the subsequent thinning operation executed by means of grinding. This polyimide layer has applied thereto an adhesive layer by means of spraying or spinning. The wafer is then placed on a surface of a substrate in such a way that the adhesive layer faces said surface. In order to fix the wafer to the substrate, a predetermined pressure and a predetermined temperature are used so as to cure the adhesive layer. Following this, the wafer is thinned from the back by means of grinding. The thinned wafer is then placed on a needle block and immersed in a solvent so as to dissolve the adhesive layer; making use of a vacuum device, the individual chips are then removed from the needle block and placed in chip carriers.

U.S. Pat. No. 5,071,792 refers to a method of forming ultrathin integrated circuit chips. In a first step, grooves are produced in the front of the wafer. These grooves are then filled with a hard material acting as a grinding stop. This material is then planarized and a wax is applied thereto, which provides a temporary adhesion between a passivation coating and the planar surface of an intermediate support. Following this, the back of the wafer is ground so as to dice the chips. The comparatively hard material in the grooves acts here as a grinding stop. After the grinding process, the grinding stop material is removed from the grooves. In order to obtain the individual chips, the wax film is finally melted.

SUMMARY OF THE INVENTION

It is the object of the present invention to provide a reasonably-priced but still reliable method of dicing a wafer for obtaining very thin circuit chips.

In accordance with the present invention, this object is achieved by a method of dicing a wafer which comprises a plurality of circuit structures, said method comprising the steps of: defining a trench between at least two circuit structures on one face of the wafer; forming the trench down to a defined depth by means of dry etching; fixing to said one face of the wafer a re-detachable intermediate support composed of a fixed intermediate support substrate and an adhesive medium which is applied to said intermediate support substrate and which can specifically be modified in terms of its adhesive strength and which can specifically be modified in terms of its adhesive strength, said adhesive medium being an adhesive foil which is adherent on both sides, the side of the adhesive foil which is secured to said one face of the wafer having the variable adhesive strength, and said adhesive strength being adapted to be reduced by heating or by applying ultra violet radiation; thinning the wafer by dry-etching, which is secured to the intermediate support, from the opposite face so as to obtain individual circuit chips which are held by the intermediate support; and removing the individual circuit chips from the intermediate support by heating said intermediate support or by applying ultra violet radiation to the adhesive foil so as to reduce the adhesive strength of said adhesive foil to such an extent that the circuit chips can be detached from the intermediate support.

The present invention is based on the finding that, for obtaining very thin circuit chips, mechanical effects must be eliminated as far as possible when the wafer is being diced. The danger that individual circuit chips may be damaged due to mechanical effects can be reduced markedly in this way. When very thin circuit chips are produced, it must be taken into account that the active region of a circuit chip may extend as deep as a few micrometers into the semiconductor material. When thin circuit chips having a thickness in the order of 20 $\mu$m are considered, only less than 20 $\mu$m will remain as a "support substrate" for the active region of the circuit chip. The present invention therefore departs from the concept of mechanical dicing, which is accomplished e.g. by scribing, sawing or breaking of thin connections defined by trenches, as has been explained hereinbefore, an executes dicing by means of dry etching from the back.

According to the present invention, a wafer comprising a plurality of circuit structures is diced in such a way that a trench is first defined between at least two circuit structures. Subsequently, the trench is deepened down to a defined depth. Following this, a re-detachable intermediate support is fixed to the wafer face having the trench formed therein, whereupon the wafer is subjected to dry-etching from the opposite face until the trenches are exposed. In this way, a dicing process is achieved in the case of which the circuit chips have not been subjected to mechanical stresses.

When, in accordance with a specially preferred embodiment, also the trench is formed by dry-etching instead of being formed mechanically, the individual circuit chips will not be subjected to any mechanical stress at all during the whole wafer dicing process. This has the effect that also very thin circuit chips can be produced, without any marked increase in the reject rate.

According to a preferred embodiment, the wafer is pre-thinned by means of wet-chemical etching or grinding before the back is subjected to dry-etching, the pre-thinning with the aid of mechanical means being executed only to such an extent that it is almost impossible that the material which will finally form the circuit chips has already been impaired mechanically.

The component used as an intermediate support is preferably an adhesive foil which is adherent on both sides and one side of which adheres to a wafer substrate, whereas the other side thereof is connected to the wafer to be diced and has a variable adhesive strength so that, after the dry-etching step, the adhesive strength of this side of the adhesive foil can be reduced to such an extent that the diced circuit chips can easily be detached for further processing, said reduction of the adhesive strength being caused by heating or by exposure to UV radiation.

Even if the trench is implemented by means of careful mechanical processing methods, it will already be possible to produce a plurality of circuit chips with a comparatively low reject rate due to the dry-etching from the back for the purpose of dicing the wafer. Such circuit chips can have a thickness which is less than 50 $\mu$m and which especially amounts to about 20 $\mu$m and can even be reduced down to 5 $\mu$m.

If, however, in accordance with the preferred course of action, also the trench is produced by dry-etching, i.e. without subjecting the material to excessive stress, a certain number of further advantages will be achieved insofar as the wafer areas which will finally define the thin circuit chips are not subjected to any mechanical stresses at all.

Due to the fact that the trench need not be particularly deep, since the chips are very thin, the formation of a trench in a process making use of a mask for etching is, in general, carried out in a comparatively short period of time so that, in comparison with sawing of a wafer, which may last several hours especially in the case of small chips and wafers having a diameter of 20 to 30 cm, a substantial increase in the throughput can be achieved. In addition, a substantially larger number of chips can—again in comparison with sawing—be accommodated on a wafer, especially in the case of small chips, since trenches produced by sawing normally have a thickness of approx. 100 $\mu$m, whereas only 10 $\mu$m will suffice for dry-etched trenches down to the aimed-at depth, which will correspond approximately to the thickness of the circuit chips. In particular in the case of small chips, the number of chips per wafer can be increased by up to 10 to 15%.

Due to the fact that at least the back of the chips and, preferably, also the lateral edges thereof are subjected to an etch treatment, the chips are mechanically undamaged; this will be particularly important when the chips have to be bent, as will e.g. the case if the chips have to be incorporated in electronic labels.

Finally, arbitrary chip shapes can be produced especially by dry-etching the trench, i.e. the chip shapes that can be produced are not limited to rectangular shapes, as in the case of sawing; this can be of decisive importance especially in connection with power semiconductors, since chip corners, which would otherwise generate very high electric fields, can be eliminated. Finally, also the position of the chips can unequivocally be identified from the back, a circumstance which will be of great advantage e.g. for die bonding and for recognizing chips of good quality and those of poor quality.

BRIEF DESCRIPTION OF THE DRAWINGS

In the following, preferred embodiments of the present invention will be explained in detail making reference to the drawings enclosed, in which.

DETAILED DESCRIPTION OF PREFERRED EMBODIMENTS

Figure 1:
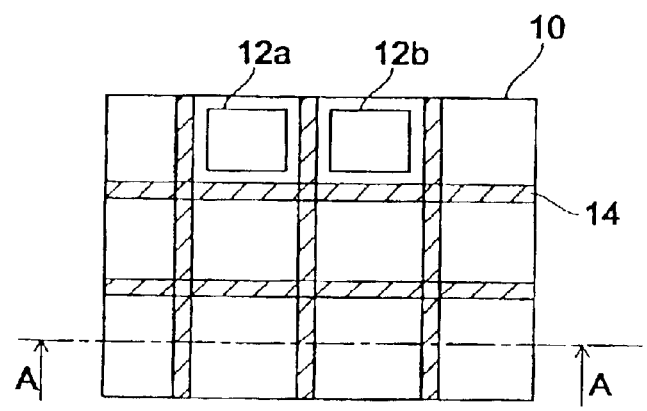
FIG. 1 shows a top view of a wafer which comprises a plurality of circuit chips and in which a trench is defined.

FIG. 1 shows a top view of a detail of a wafer 10 comprising a plurality of fully processed individual circuit structures 12a, 12b. The wafer 10 has already defined thereon a trench 14. In cases in which the trench 14 is produced mechanically, the trench can be defined e.g. by inputting the coordinates for a sawing or scribing means. In cases in which the trench 14 is produced by making use of a dry-etching process, the trench is formed by applying a resist mask with side-wall protection by polymer deposition. Alternatively, the etch mask defining the trench 14 can also be implemented as an $SiO_2$ mask. Summarizing, it can be stated that all the methods of forming an etch mask can be used for defining the trench 14.

Figure 2:
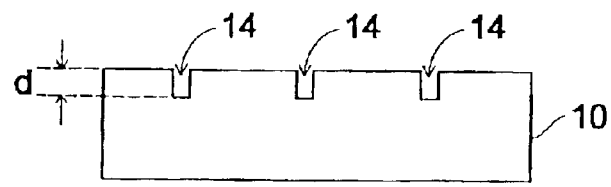
FIG. 2 shows a cross-sectional view of the wafer of FIG. 1 having the trench formed therein.

FIG. 2 shows a cross-sectional view along the line A—A of FIG. 1 through the wafer 10 in a state in which the trench 14 has been formed down to a certain depth d. The predetermined thickness is chosen such that it is at least equal to the target thickness of the circuit chip to be produced so that the circuit chips can be diced later on without being mechanically acted upon.

If e.g. the process with polymer deposition is used, $SF_6$ can be used as an etching gas and $CHF_3$ and $C_2F_6$ can be used as polymer protection. More details with regard to this method are disclosed in DE 4241045.

If a process with an $SiO_2$ mask is used, a mixture of HBr, $Cl_2$, $O_2$ and He can be used as an etching gas. In addition, all the other known dry-etching processes can be used. Dry-etching in general has the substantial advantage that, in contrast to a mechanical implementation of the trench, the edges of the circuit chip are not subjected to mechanical stress and are therefore stable.

Figure 3:
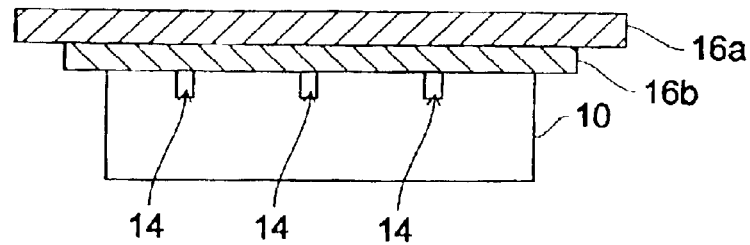
FIG. 3 shows a view of the wafer of FIG. 2 which is secured to an intermediate support.

FIG. 3 shows the circuit chip 10, which is provided with the trench 14, after it has been secured to an intermediate support which can be composed of a substrate wafer 16a and an adhesive medium 16b. The medium used as an adhesive medium 16b is preferably an adhesive foil which is adherent on both sides, one side of this adhesive foil being provided with a special coating which loses its adhesive strength when it has been heated to a temperature of e.g. 90 to 140°. The other side does not have a varying adhesive strength. The support foil is attached in such a way that the side with the non-varying adhesive strength is connected to the wafer support 16a, whereas the side with the varying adhesive strength is connected to the semiconductor wafer 10, as can be seen in FIG. 3. An essential property of the intermediate support 16a, 16b is that the adhesive connection with the wafer 10 can be released. In addition, a full-area, cavity-free connection will be of advantage.

Alternative materials for the adhesive medium 16b are thermoplastic materials or adhesive foils whose adhesive strength can be varied not by means of heat but by means of UV light. If UV-sensitive foils are used, the support substrate 16a must be transparent. In this case, a glass wafer can be used as a support substrate.

Figure 4:
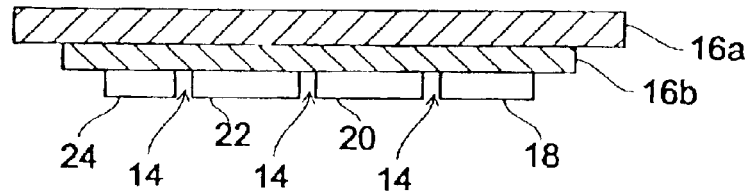
FIG. 4 shows a view of the wafer of FIG. 3 after thinning of the wafer by means of a dry-etching process.

When the wafer 10 has been glued onto the intermediate support 16a, 16b, the wafer is thinned from the back, as shown in FIG. 4. If the initial wafer 10 is already comparatively thin, it will presumably suffice to use only a dry-etching process so as to separate the individual circuit chips from one another, i.e. so as to remove the back at least up to the trench. If the wafer in question is, however, a thick wafer, e.g. a wafer having a thickness of 700 µm, which is a typical value for commercially available wafers, a faster method, such as mechanical grinding, wet etching or the like, is preferably used prior to the final dry-etching step for dicing the circuit chips. A method which proved to be advantageous is the so-called spin-etching in the case of which the wafer lies on a rotating disk while the etching medium flows onto the disk from above and is spun off therefrom.

When the wafer has been pre-thinned to a predetermined thickness, the last step of dicing is left to the dry-etching process. The etching gases preferably used for executing this step are the etching gas mixture $Cl_2$ and $CF_4$, or $SF_6$ as a single etching gas. It should here be noted that a chemical treatment with chlorine and fluorine is generally well suited for etching silicon. The etching gas $NF_3$ is very efficient as well, but, at present, it is still comparatively expensive; hence, it is one of the less preferred etching gases at the present time.

Figure 5:
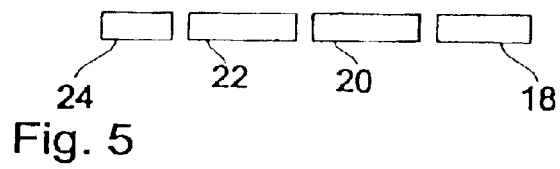
FIG. 5 shows the individual circuit chips after their removal from the intermediate support.

As can be seen in FIG. 4, individual circuit chips 18, 20, 22 and 24 have now been created, which are no longer connected to one another but which are only held by the adhesive medium 16b. In cases in which an adhesive foil is used which is adherent on both sides and which has a variable adhesive strength on one side thereof, the individual circuit chips 18, 20, 22, 24 can now easily be removed by varying the adhesive strength so that they will then exist completely independently of one another, as can be seen in FIG. 5, whereupon they are picked up by an assembly machine or a similar device so as to be accommodated at their final location.

It should here be pointed out that this method is suitable not only for silicon wafers but also for GaAs wafers, which are particularly sensitive to mechanical stress due to their brittleness, as well as for other III-V semiconductors. It goes without saying that for semiconductor materials other than silicon etching gases other than the above-mentioned ones are also used.

The diced thin circuit chips 18, 20, 22, 24 can be used in electronic components and systems requiring an extremely small volume demand, e.g. in mobile telecommunications systems or medical monitoring and assistance systems, such as hearing aids, cardiac pacemakers, monitoring and diagnostic units worn on the body, etc.

Other fields of use are electronic components which are optimized for electric signal transmission, such as high-frequency components.

Finally, the thin circuit chips diced according to the present invention can be combined so as to obtain circuit modules which comprise individual components consisting of different basic materials or in which chips originating from different manufacturing technologies are joined. Ultrathin circuit chips can be used especially in systems consisting of memory chips, logic chips, sensor components, chip-card chips, power components or high-frequency transmission chips (transponders).

Due to their very small thickness, thin circuit chips produced according to the present invention contribute to the overall volume of the component only as a thin film. A complete chip system consisting e.g. of a normal chip and an ultrathin chip is, in the final analysis, not much larger than a standard integrated circuit.

Due to the small thickness of the diced circuit chips, it is now also possible to use surface treatment techniques for contacting and wiring individual chips in a multi-chip module making use of conventional techniques which require planar or almost planar surfaces.

Finally, the method according to the present invention can be used for dicing not only specially produced or pretreated circuit wafers but all wafers which can be obtained from arbitrary manufacturers as fully processed wafers.

What is claimed is:

1. A method of dicing a wafer which comprises a plurality of circuit structures, said method comprising the steps of:

defining a trench between at least two circuit structures on one face of the wafer;

forming the trench down to a defined depth by means of dry etching;

fixing to said one face of the wafer a re-detachable intermediate support composed of a fixed intermediate support substrate and an adhesive medium which is applied to said intermediate support substrate and which can specifically be modified in terms of its adhesive strength and which can specifically be modified in terms of its adhesive strength, said adhesive medium being an adhesive foil which is adherent on both sides, the side of the adhesive foil which is secured to said one face of the wafer having the variable adhesive strength, and said adhesive strength being adapted to be reduced by heating or by applying ultra violet radiation;

thinning the wafer by dry-etching, which is secured to the intermediate support, from the opposite face so as to obtain individual circuit chips which are held by the intermediate support; and removing the individual circuit chips from the intermediate support by heating said intermediate support or by applying ultra violet radiation to the adhesive foil so as to reduce the adhesive strength of said adhesive foil to such an extent that the circuit chips can be detached from the intermediate support.

2. A method according to claim 1, wherein the dry-etching step of the other face of the wafer is executed until the circuit chips have a thickness which is smaller than 50 $\mu$m and which is preferably 20 $\mu$m.

3. A method according to claim 1,
wherein the forming of the trench is carried out such that a predetermined thickness is reached, which corresponds to a target chip thickness; and
wherein the step of dry-etching the other face of the wafer is executed until the trench has substantially been reached.

4. A method according to claim 1,
wherein, prior to the step of dry etching the other face of the wafer, a pre-thinning step is executed in such a way that the circuit chips are still interconnected across the trench and that the thickness of this connection has a specific value.

5. A method according to claim 4, wherein the pre-thinning step comprises grinding, wet-chemical etching or a combination thereof.

6. A method according to claim 1, wherein in the trench-defining step a trench having at least one round portion is defined.

7. A method according to claim 1, wherein the wafer consists of Si, GaAs or some other III-V semiconductor.

8. A method according to claim 1, wherein the defining step comprises the application of an $SiO_2$ mask or of a resist mask with side-wall protection by polymer deposition.

* * * * *